(12) United States Patent
Chiou et al.

(10) Patent No.: US 7,697,259 B2
(45) Date of Patent: Apr. 13, 2010

(54) VEHICLE WITH ELECTROSTATIC CHARGE ELIMINATORS

(75) Inventors: Chian-Chen Chiou, Yuanlin Township, Changua County (TW); Chi-Chien Chang, Sindian (TW); Shun Chih Hsieh, Hsinchu (TW); Yi Heng Lin, Jhubei (TW); Hsiao-Lung Sun, Danshui Town (TW); Nien-Hua Chang, Kaohsiung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 1163 days.

(21) Appl. No.: 11/295,026

(22) Filed: Dec. 5, 2005

(65) Prior Publication Data

US 2007/0126322 A1  Jun. 7, 2007

(51) Int. Cl.
 *H01T 23/00* (2006.01)
(52) U.S. Cl. ........................................ 361/231
(58) Field of Classification Search ................... 361/231
 See application file for complete search history.

(56) References Cited

U.S. PATENT DOCUMENTS

| 4,605,988 | A | * | 8/1986 | Nienhuis et al. ............. 361/829 |
| 4,720,048 | A | * | 1/1988 | Maroney et al. ......... 280/47.34 |
| 6,247,599 | B1 | | 6/2001 | Cheng et al. |

* cited by examiner

*Primary Examiner*—Stephen W Jackson
(74) *Attorney, Agent, or Firm*—Tung & Associates

(57) ABSTRACT

A novel vehicle which is suitable for transporting and/or temporarily storing objects such as masks or reticles and is effective in eliminating or preventing electrostatic discharges on the masks, reticles or other objects. The vehicle includes a frame for receiving the objects and at least one ESD eliminator provided on the frame for neutralizing electrostatic charges on the objects. Neutralization of the electrostatic charges prevents electrostatic discharges from damaging microelectronic circuits, for example, on the masks, reticles or other objects.

20 Claims, 2 Drawing Sheets

VEHICLE WITH ELECTROSTATIC CHARGE ELIMINATORS

FIELD OF THE INVENTION

The present invention relates to masks and reticles used to form circuit patterns on semiconductor wafer substrates in the fabrication of integrated circuits on the substrates. More particularly, the present invention relates to a mask- or reticle-carrying vehicle which is provided with an electrostatic charge eliminator or eliminators to eliminate or neutralize electrostatic charges and prevent electrostatic discharge on the masks, reticles or other objects carried on the vehicle during transport.

BACKGROUND OF THE INVENTION

The fabrication of various solid state devices requires the use of planar substrates, or semiconductor wafers, on which integrated circuits are fabricated. The final number, or yield, of functional integrated circuits on a wafer at the end of the IC fabrication process is of utmost importance to semiconductor manufacturers, and increasing the yield of circuits on the wafer is the main goal of semiconductor fabrication. After packaging, the circuits on the wafers are tested, wherein non-functional dies are marked using an inking process and the functional dies on the wafer are separated and sold. IC fabricators increase the yield of dies on a wafer by exploiting economies of scale. Over 1000 dies may be formed on a single wafer which measures from six to twelve inches in diameter.

Various processing steps are used to fabricate integrated circuits on a semiconductor wafer. These steps include deposition of a conducting layer on the silicon wafer substrate; formation of a photoresist or other mask such as titanium oxide or silicon oxide, in the form of the desired metal interconnection pattern, using standard lithographic or photolithographic techniques; subjecting the wafer substrate to a dry etching process to remove the conducting layer from the areas not covered by the mask, thereby etching the conducting layer in the form of the masked pattern on the substrate; removing or stripping the mask layer from the substrate typically using reactive plasma and chlorine gas, thereby exposing the top surface of the conductive interconnect layer; and cooling and drying the wafer substrate by applying water and nitrogen gas to the wafer substrate.

Photoresist materials are coated onto the surface of a wafer by dispensing a photoresist fluid typically on the center of the wafer as the wafer rotates at high speeds within a stationary bowl or coater cup. The coater cup catches excess fluids and particles ejected from the rotating wafer during application of the photoresist. The photoresist fluid dispensed onto the center of the wafer is spread outwardly toward the edges of the wafer by surface tension generated by the centrifugal force of the rotating wafer. This facilitates uniform application of the liquid photoresist on the entire surface of the wafer.

Spin coating of photoresist on wafers is carried out in an automated track system using wafer handling equipment which transport the wafers between the various photolithography operation stations, such as vapor prime resist spin coat, develop, baking and chilling stations. Robotic handling of the wafers minimizes particle generation and wafer damage. Automated wafer tracks enable various processing operations to be carried out simultaneously. Two types of automated track systems widely used in the industry are the TEL (Tokyo Electron Limited) track and the SVG (Silicon Valley Group) track.

The numerous processing steps outlined above are used to cumulatively apply multiple electrically conductive and insulative layers on the wafer and pattern the layers to form the circuits. The final yield of functional circuits on the wafer depends on proper application of each layer during the process steps. Proper application of those layers depends, in turn, on coating the material in a uniform spread over the surface of the wafer in an economical and efficient manner.

During the photolithography step of semiconductor production, light energy is applied through a reticle mask onto the photoresist material previously deposited on the wafer to define circuit patterns which will be etched in a subsequent processing step to define the circuits on the wafer. Because these circuit patterns on the photoresist represent a two-dimensional configuration of the circuit to be fabricated on the wafer, minimization of particle generation and uniform application of the photoresist material to the wafer are very important. By minimizing or eliminating particle generation during photoresist application, the resolution of the circuit patterns, as well as circuit pattern density, is increased.

A reticle is a transparent plate patterned with a circuit image to be formed in the photoresist coating on the wafer. A reticle contains the circuit pattern image for only a few of the die on a wafer, such as four die, for example, and thus, must be stepped and repeated across the entire surface of the wafer. In contrast, a photomask, or mask, includes the circuit pattern image for all of the die on a wafer and requires only one exposure to transfer the circuit pattern image for all of the dies to the wafer. Reticles are used for step-and-repeat steppers and step-and-scan systems found in wafer fabrication.

Reticles must remain meticulously clean for the creation of perfect images during its many exposures to pattern a circuit configuration on a substrate. The reticle may be easily damaged such as by dropping of the reticle, the formation of scratches on the reticle surface, electrostatic discharge (ESD), and particles. ESD can cause discharge of a small current through the chromium lines on the surface of the reticle, melting a circuit line and destroying the circuit pattern.

Reticles are transferred among various stations in a semiconductor fabrication facility in reticle pods, such as SMIF (standard mechanical interface) pods. SMIF pods are generally characterized by a pod door which mates with a pod shell to provide a sealed environment in which the reticles may be stored and transferred. In order to transfer reticles between a SMIF pod and a process tool in a fab, the pod is typically loaded either manually or automatically on a load port on the process tool. Once the pod is positioned on the load port, mechanisms in the port door unlatch the pod door from the pod shell such that the reticle may be transferred from within the pod into the process tool. Another mode of reticle transfer includes the use of a wheeled cart or vehicle which includes a frame and multiple shelves on which are supported the reticles.

Within a cleanroom environment, reticles are typically hand-carried from a stocker to a step-and-scan system which is used to transfer the circuit pattern image of the reticle to the wafer substrate. Typically, the step-and-scan system can only hold two reticles at a time, whereas a succession of multiple reticles may be used in the step-and-scan operations throughout a single day. Thus, many of the reticles must be placed on a reticle vehicle or other support to await the step-and-scan procedure.

To minimize damage to the reticles by electrostatic discharge (ESD) as the reticles are hand-carried or transported from the reticle stocker to the step-and-scan system, multiple ESD eliminators are provided in the cleanroom, typically beneath the cleanroom ceiling. As is well known, such ESD eleminators (also known as static eliminators or electrostatic eliminators) typically include a pair of discharge electrodes across which a high-voltage A.C. current is applied to generate ions of each polarity. Air is blown downwardly into the cleanroom environment through vents in the ceiling, and this air carries the ions generated by the ESD eliminators to the surfaces of the reticles and prevents the buildup of electrostatic charges which may otherwise discharge and damage the reticles.

One of the problems inherent in the conventional use of multiple ESD eliminators mounted beneath the ceiling of the cleanroom is that many areas in the cleanroom lack sufficient downflow of air to facilitate sufficient transfer of the neutralizing ions from the ESD eliminators to the surfaces of the reticles. This increases the likelihood of ESD-induced damage to the reticles as they are carried or transported from the reticle stocker to the step-and-scan system and as they await their turn for the step-and-scan procedure. Accordingly, a novel reticle vehicle which is equipped with an electrostatic charge eliminator or eliminators is needed for the transport and/or temporary storage of masks or reticles in a cleanroom environment.

An object of the present invention is to provide a novel vehicle which is suitable for applications including but not limited to the transport and/or storage of masks or reticles.

Another object of the present invention is to provide a vehicle which is equipped with at least one ESD eliminator and is capable of transporting and/or temporarily storing a variety of objects while preventing electrostatic discharges on the objects.

Still another object of the present invention is to provide a novel vehicle which includes an electrostatic charge (ESC) eliminator or eliminators for eliminating electrostatic charges on objects transported and/or stored on the vehicle.

Yet another object of the present invention is to provide a novel vehicle with an electrostatic charge eliminator or eliminators which are capable of preventing electrostatic discharge damage to sensitive electronic circuits provided on devices transported and/or stored on the vehicle.

A still further object of the present invention is to provide a novel vehicle which may include a vehicle frame for supporting an object or objects and at least one electrostatic charge eliminator provided on the frame for neutralizing electrostatic charges and preventing electrostatic discharges on the object or objects.

Yet another object of the present invention is to provide a novel vehicle with electrostatic charge eliminators, which vehicle may be used in a variety of applications including but not limited to transport and/or storage of reticles or masks from a reticle or mask stocker and a stepper or scanning system for the formation of a circuit pattern from the reticle or mask onto a semiconductor wafer substrate.

SUMMARY OF THE INVENTION

In accordance with these and other objects and advantages, the present invention is generally directed to a novel vehicle which is suitable for transporting and/or temporarily storing objects such as masks or reticles and is effective in eliminating or preventing electrostatic discharges on the masks, reticles or other objects. The vehicle includes a frame for receiving the objects and at least one ESD eliminator provided on the frame for neutralizing electrostatic charges on the objects. Neutralization of the electrostatic charges prevents electrostatic discharges from damaging microelectronic circuits, for example, on the masks, reticles or other objects.

The frame is typically portable and may include multiple ESD eliminators. A power supply module provided on the frame and connected to each of the ESD eliminators may include a battery which is charged from a standard AC outlet using an AC connector cord and plug. The power supply module may include an AC/DC selector switch for selecting between the use of alternating current to power the electrostatic charge eliminator or eliminators from an AC outlet or the use of direct current to charge the battery for energizing the electrostatic charge eliminator or eliminators apart from the AC outlet.

Each of the ESD eliminators may include a housing having positive and negative discharge electrodes. A fan may be provided in the housing for drawing air through the housing and into contact with the discharge electrodes. The discharge electrodes in the housing generate positive and negative ions which are blown by the fan into contact with the surfaces of the masks, reticles or other objects provided on the vehicle to neutralize electrostatic charges on the objects and prevent electrostatic discharges which would otherwise damage the masks or reticles or microelectronic devices on the objects.

BRIEF DESCRIPTION OF THE DRAWINGS

The invention will now be described, by way of example, with reference to the accompanying drawings, in which.

DESCRIPTION OF THE PREFERRED EMBODIMENTS

The present invention has particularly beneficial utility in the transport of masks or reticles from a stocker to a stepper or scanner system or between other locations in a cleanroom environment of a semiconductor fabrication facility during the fabrication of integrated circuits on the substrates. However, the invention is not so limited in application, and while references may be made to such masks or reticles, the present invention is more generally applicable to the transport and/or storage of objects not limited to masks and reticles and neutralization of electrostatic charges on the objects in a variety of industrial and mechanical applications.

Shown throughout the drawings, the present invention is directed to a novel vehicle for the transport and/or storage of objects such as masks or reticles which are sensitive to electrostatic discharges (ESDs). The vehicle includes a vehicle frame which receives the masks, reticles or other objects. At least one electrostatic charge eliminator is provided on the vehicle frame for generating neutralizing ions which neutralize or eliminate positive and negative electrostatic charges on the masks, reticles or other objects. Accordingly, potential electrostatic discharges which otherwise might damage the masks, the reticles or microelectronic devices, for example, on the objects are prevented.

The vehicle frame is typically provided with wheels for rendering the frame portable. A power supply module which receives a supply of current and energizes each of the electrostatic charge eliminators may be provided on the vehicle frame. The power supply module may include a battery which is charged using an AC connector cord and plug using a standard AC electrical outlet. The power supply module may further include an AC/DC switch for converting alternating current to direct current for energizing the electrostatic charge eliminator or eliminators apart from the AC electrical outlet.

Figure 1:
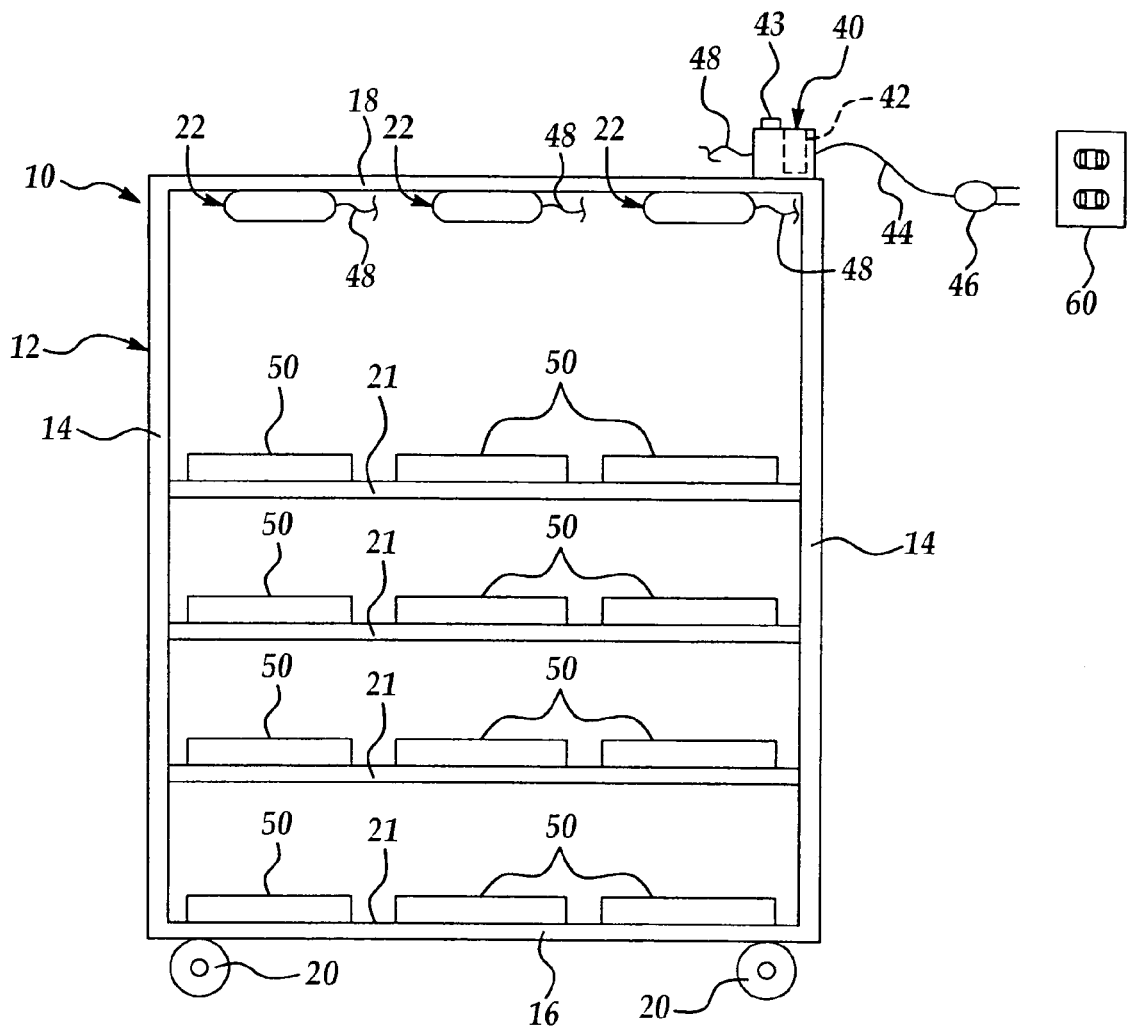
FIG. 1 is a partially schematic side view of an illustrative embodiment of the vehicle with electrostatic charge eliminators of the present invention.
Figure 2:
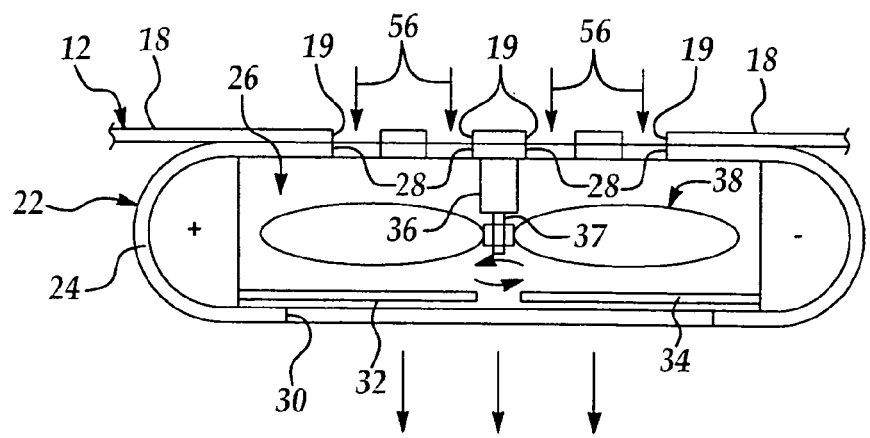
FIG. 2 is a sectional view of an illustrative electrostatic charge eliminator suitable for implementation of the present invention.

Referring initially to FIGS. 1 and 2, an illustrative embodiment of the vehicle with electrostatic charge eliminators, hereinafter referred to as the vehicle, of the present invention is generally indicated by reference numeral 10. The vehicle 10 includes a vehicle frame 12 which may be stainless steel and typically includes multiple vertical frame members 14 that support a rectangular bottom frame member 16 a rectangular top frame member 18. Multiple shelves 21 are further supported by the vertical frame members 14, between the bottom frame member 16 and the top frame member 18. Wheels 20 may be provided typically on the bottom frame member 16 to facilitate transport of the vehicle frame 12.

As further shown in FIG. 1, at least one, and typically, multiple electrostatic charge eliminators 22 are provided on the vehicle frame 12, typically on the bottom surface of the top frame member 18. As shown in FIG. 2, each of the electrostatic charge eliminators 22 may include a housing 24 having a housing interior 26. At least one upper air opening 28 extends through the upper portion of the housing 24, and at least one lower air opening 30 extends through the lower portion of the housing 24. The upper air openings 28 typically register with air openings 19 that extend through the top frame member 18 of the vehicle frame 12.

A fan 38 in the housing interior 26 is mounted on a motor shaft 37 that is engaged by an electric motor 36. The electric motor 36 is mounted on the interior surface of the housing 24, inside the housing interior 26. A positive discharge electrode 32 and a negative discharge electrode 34 are provided in the housing interior 26, adjacent to the discharge end of the fan 38. The positive charge electrode 32 and the negative charge electrode 34 may be any type of electrode known by those skilled in the art which is suitable for use in conventional electrostatic charge eliminators. In application of the vehicle 10 as hereinafter described, a voltage potential is applied across the positive discharge electrode 32 and the negative discharge electrode 34. Simultaneously, the fan 38 is rotated by the electric motor 36 in the housing interior 26 to draw air 56 through the air openings 19 and upper air openings 28, respectively; through the housing interior 26; and across the positive discharge electrode 32 and the negative discharge electrode 34, respectively. As it contacts the electrodes 32, 34, the air dissociates into positive and negative ions which are blown from the housing interior 26 through the lower air opening 30.

A power supply module 40 is mounted typically on the top frame member 18 of the vehicle frame 12 and is connected to the electric motor 36, the positive discharge electrode 32 and the negative discharge electrode 34 via wiring 48. The power supply module 40 typically operates under 110V/60 Hz AC power and includes an AC connector cord 44 having an AC connector plug 46 for insertion in a standard AC electrical outlet 60, as hereinafter further described. The power supply module 40 may further include a battery 42 to facilitate powering of the electrostatic charge eliminators 22 apart from the AC electrical outlet 60. In that embodiment, the power supply module 40 includes a rectifier and an AC/DC selector switch 43 which enables selection between powering of the electrostatic charge eliminators 22 using alternating current from the AC electrical outlet 60 and conversion of the alternating current from the AC electrical outlet 60 into direct current through the rectifier for charging of the battery 42, according to the knowledge of those skilled in the art.

Figure 3:
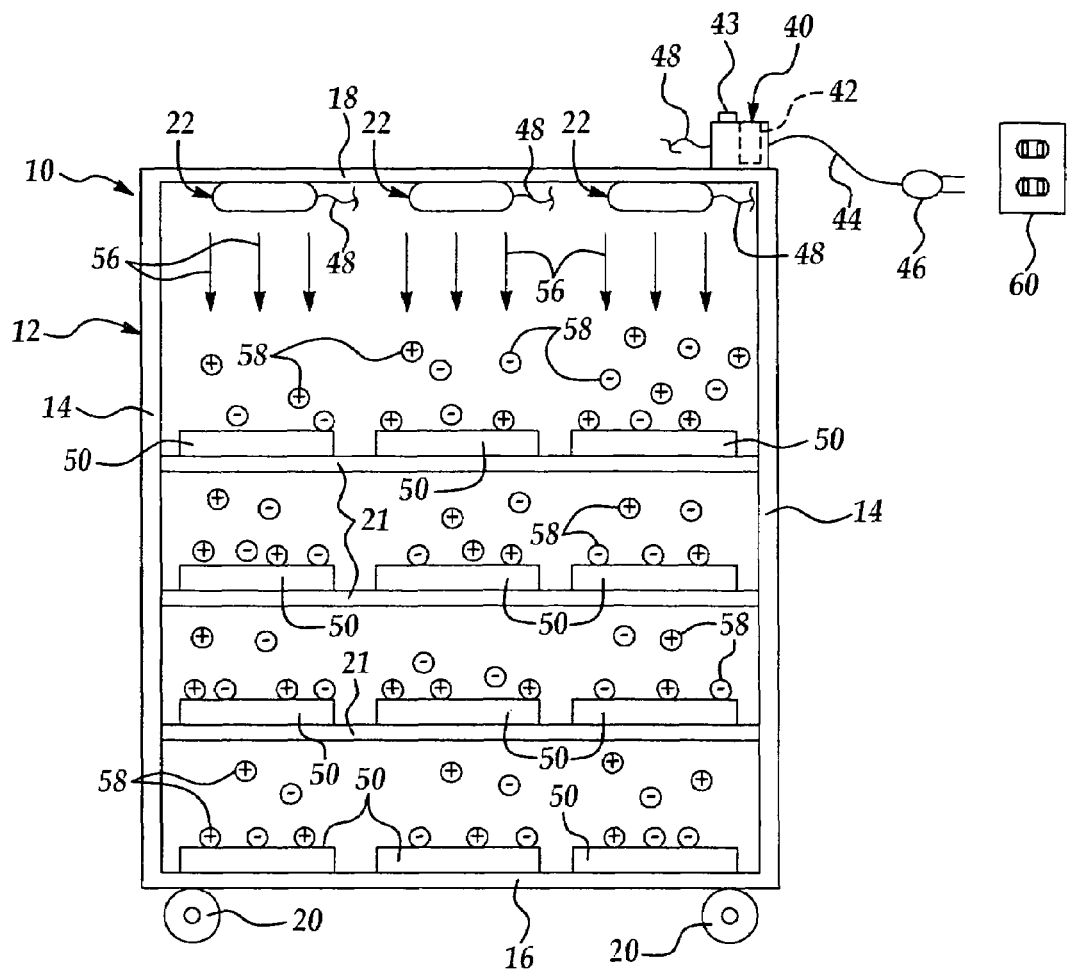
FIG. 3 is a partially schematic side view of an illustrative embodiment of the vehicle with electrostatic charge eliminators of the present invention, in implementation of the invention.
Figure 4:
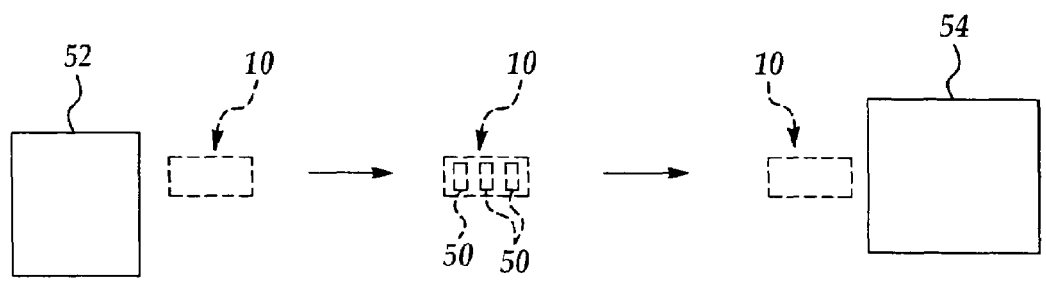
FIG. 4 is a schematic view illustrating transport of masks or reticles from a stocker to a step-and-scan system in typical application of the present invention.

Referring next to FIGS. 2-4, in typical operation the vehicle 10 is used to transport multiple reticles 50 from a stocker 52 to a step-and-scan system 54 where the reticles 50 are used in a photolithography operation to transfer circuit patterns from the reticle 50 onto a semiconductor wafer substrate (not shown), typically in conventional fashion. Alternatively, the vehicle 10 may be used to transport masks (not shown) or other objects (not shown) which may include microelectronic devices, for example, that are vulnerable to electrostatic discharge. The battery 42 of the power supply module 40 is initially charged by manipulating the AC/DC selector switch 43 to the "DC" position on the power supply module 40 and inserting the AC connector plug 46 into the AC electrical outlet 60. This causes conversion of the alternating current from the AC electrical outlet 60 into direct electrical current, which is routed into the battery 42. After the battery 42 is sufficiently charged for powering the electrostatic charge eliminators 22, the AC connector plug 46 is removed from the AC electrical outlet 60. The reticles 50 are loaded onto the shelves 21 for subsequent transport of the reticles 50 from the stocker 52 to the step-and-scan system 54.

After the reticles 50 are loaded onto the shelves 21, each of the electrostatic charge eliminators 22 is energized by the battery 42 typically via actuation of an on/off switch (not shown) provided on the vehicle frame 12 or other suitable location. This powers the electric motor 36, which rotates the fan 38 in the housing interior 26, as well as establishes a voltage potential between the positive discharge electrode 32 and the negative discharge electrode 34. Accordingly, as shown in FIG. 2, ambient air 56 is drawn through the air openings 19 in the top frame member 18 of the vehicle frame 12 and the upper air openings 28 in the upper portion of the housing 24; through the housing interior 26; and into contact with the electrodes 32, 34, which generate positive and negative neutralizing ions 58 from the flowing air 56, as shown in FIG. 3. The neutralizing ions 58 are blown by the fan 38 from the housing interior 26, through the lower air opening 30 and into contact with the surfaces of the respective reticles 50, thereby neutralizing and eliminating electrostatic charges and preventing electrostatic discharges on the reticles 50. This ion neutralization process is continued as the vehicle 10 traverses the distance between the stocker 52 and the step-and-scan system 54, as shown in FIG. 4. In a preferred embodiment, the fully-charged battery 42 is capable of energizing the electrostatic charge eliminators 22 for typically at least about 30 minutes to ensure continuous neutralization of electrostatic charges on the reticles 50 throughout the transport process.

After the vehicle 10 arrives at the load port for the step-and-scan system 54, as indicated by the phantom lines in FIG. 4, the reticles 50 may be unloaded from the vehicle 10 onto the load port of the system 54 to carry out the photolithography alignment and exposure process. Alternatively, the reticles 50 may remain on the vehicle 10 while reticles 50 previously loaded into the system 54 undergo the alignment and exposure process. In that case, the electrostatic charge eliminators 22 may be powered using an AC electrical outlet 60 through the AC connector cord 44. Accordingly, the AC connector plug 46 is plugged into the AC electrical outlet 60 and the AC/DC selector switch 43 is manipulated to the "AC power" position on the power supply module 40, such that AC electrical power flows from the AC electrical outlet 60, through the AC connector cord 44 and power supply module 40 to the electrostatic charge eliminators 22, bypassing the battery 42. Continuous operation of the electrostatic charge eliminators 22 neutralizes electrostatic charges on the reticles 50 and thereby prevents electrostatic discharges from occurring on the reticles 50 as the reticles 50 wait on the vehicle 10 for subsequent photolithography alignment and exposure in the step-and-scan system 54.

While the preferred embodiments of the invention have been described above, it will be recognized and understood that various modifications can be made in the invention and the appended claims are intended to cover all such modifications which may fall within the spirit and scope of the invention.

What is claimed is:

1. A vehicle for objects comprising:
   a vehicle frame for receiving the objects;
   at least one electrostatic charge eliminator carried by said vehicle frame for neutralizing electrostatic charges on the objects;
   said at least one electrostatic charge eliminator comprises a housing;
   a fan provided in said housing for rotation in said housing; and
   a pair of discharge electrodes provided in said housing adjacent to said fan.

2. The vehicle of claim 1 wherein said at least one electrostatic charge eliminator comprises a plurality of electrostatic charge eliminators.

3. The vehicle of claim 1 wherein said objects comprise mask.

4. The vehicle of claim 1 further comprising a plurality of shelves carried by said vehicle frame for supporting the objects.

5. The vehicle of claim 4 wherein said at least one electrostatic charge eliminator comprises a plurality of electrostatic charge eliminators.

6. The vehicle of claim 1 wherein said at least one electrostatic charge eliminator comprises a plurality of electrostatic charge eliminators.

7. The vehicle of claim 1 further comprising a plurality of shelves carried by said vehicle frame for supporting the objects.

8. The vehicle of claim 7 wherein said at least one electrostatic charge eliminator comprises a plurality of electrostatic charge eliminators.

9. A vehicle for objects comprising:
   a vehicle frame for receiving the objects;
   at least one electrostatic charge eliminator carried by said vehicle frame for neutralizing electrostatic charges on the objects; and
   a power supply module carried by said vehicle frame and operably connected to said at least one electrostatic charge eliminator for energizing said at least one electrostatic charge eliminator.

10. The vehicle of claim 9 wherein said at least one electrostatic charge eliminator comprises a plurality of electrostatic charge eliminators.

11. The vehicle of claim 9 further comprising a plurality of shelves carried by said frame for supporting the objects.

12. The vehicle of claim 9 wherein said at least one electrostatic charge eliminator comprises a plurality of electrostatic charge eliminators.

13. The vehicle of claim 9 wherein said power supply module comprises an AC connector cord for receiving an alternating current, a battery electrically connected to said AC connector cord and said at least one electrostatic charge eliminator, and an AC/DC selector switch for selecting between alternating current for energizing said at least one electrostatic charge eliminator and direct current for charging said battery.

14. The vehicle of claim 13 wherein said at least one electrostatic charge eliminator comprises a plurality of electrostatic charge eliminators.

15. The vehicle of claim 13 further comprising a plurality of shelves carried by said frame for supporting the objects.

16. The vehicle of claim 13 wherein said at least one electrostatic charge eliminator comprises a housing, a fan provided in said housing for rotation in said housing, and a pair of discharge electrodes provided in said housing adjacent to said fan.

17. A vehicle for objects comprising:
   a wheeled vehicle frame for receiving the objects;
   at least one electrostatic charge eliminator carried by said vehicle frame for neutralizing electrostatic charges on the objects; and
   a power supply module carried by said vehicle frame and operably connected to said at least one electrostatic charge eliminator for energizing said at least one electrostatic charge eliminator.

18. The vehicle of claim 17 wherein said at least one electrostatic charge eliminator comprises a plurality of electrostatic charge eliminators, and further comprising a plurality of shelves carried by said frame for supporting the objects.

19. The vehicle of claim 17 wherein said power supply module comprises an AC connector cord for receiving an alternating current, a battery electrically connected to said AC connector cord and said at least one electrostatic charge eliminator, and an AC/DC selector switch for selecting between alternating current for energizing said at least one electrostatic charge eliminator and direct current for charging said battery.

20. The vehicle of claim 17 wherein said at least one electrostatic charge eliminator comprises a housing, a fan provided in said housing for rotation in said housing, and a pair of discharge electrodes provided in said housing adjacent to said fan.

* * * * *